United States Patent
Sugimoto et al.

(10) Patent No.: US 9,954,622 B2
(45) Date of Patent: Apr. 24, 2018

(54) TRANS-IMPEDANCE AMPLIFIER AND OPTICAL RECEIVER INCLUDING THE SAME

(71) Applicant: SUMITOMO ELECTRIC INDUSTRIES, LTD., Osaka-shi, Osaka (JP)

(72) Inventors: Yoshiyuki Sugimoto, Yokohama (JP); Taizo Tatsumi, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/356,159

(22) Filed: Nov. 18, 2016

(65) Prior Publication Data
US 2017/0163352 A1    Jun. 8, 2017

(30) Foreign Application Priority Data

Dec. 2, 2015 (JP) ................................ 2015-235891

(51) Int. Cl.
*H03F 3/08* (2006.01)
*H04B 10/69* (2013.01)
*H03F 1/02* (2006.01)

(52) U.S. Cl.
CPC ......... *H04B 10/691* (2013.01); *H03F 1/0233* (2013.01); *H03F 3/08* (2013.01);
(Continued)

(58) Field of Classification Search
CPC . H03F 1/0233; H03F 3/08; H03F 1/32; H03F 2200/471; H03F 1/02; H03F 3/085;
(Continued)

(56) References Cited

U.S. PATENT DOCUMENTS

| 6,788,152 B2 * | 9/2004 | Nishizono | H03F 3/08 330/308 |
| 6,876,259 B2 * | 4/2005 | Visocchi | H03F 3/08 330/308 |

(Continued)

FOREIGN PATENT DOCUMENTS

| JP | S57-046544 A | 3/1982 |
| JP | S59-29013 B2 | 7/1984 |

(Continued)

*Primary Examiner* — Khanh V Nguyen
(74) *Attorney, Agent, or Firm* — Global IP Counselors, LLP

(57) ABSTRACT

A TIA converts a current signal received at its terminal to a voltage signal. The TIA includes an amplifier that includes an input node connected to the terminal and that converts a current signal received at the input node to a voltage signal; a first diode whose cathode is connected to the terminal; a second diode whose anode is connected to the terminal; a first current source connected to an anode of the first diode, the first current source supplying a first forward current to the first diode; a second current source connected to a cathode of the second diode, the second current source supplying a second forward current to the second diode; and a controller that controls forward currents respectively generated by the first current source and the second current source in accordance with an increase and decrease in the voltage signal.

8 Claims, 8 Drawing Sheets

(52) U.S. Cl.
CPC .............. *H03F 3/085* (2013.01); *H03F 3/087* (2013.01); *H03F 2200/471* (2013.01)

(58) Field of Classification Search
CPC ....... H03F 3/087; H03F 17/00; H04B 10/691; H04B 9/00; H04B 10/69; H03G 1/0047; H03G 3/3084
USPC ................. 330/59, 308; 250/214 A, 214 AG
See application file for complete search history.

(56) References Cited

U.S. PATENT DOCUMENTS 6,949,977 B2 * 9/2005 Macciocchi .............. H03F 1/52
330/207 P
8,054,136 B2 * 11/2011 Hara ....................... H03F 1/083
330/308

FOREIGN PATENT DOCUMENTS

| | | |
|---|---|---|
| JP | H11-8522 A | 1/1999 |
| JP | 3098461 B2 | 10/2000 |
| JP | 2010213128 A | 9/2010 |

\* cited by examiner

TRANS-IMPEDANCE AMPLIFIER AND OPTICAL RECEIVER INCLUDING THE SAME

CROSS-REFERENCE TO RELATED APPLICATIONS

This claims priority under 35 U.S.C. § 119(a) to Japanese Patent Application No. 2015-235891, filed in Japan on Dec. 2, 2015, the entire contents of which are hereby incorporated herein by reference.

BACKGROUND OF THE INVENTION

1. Field of the Invention

The present invention relates to a trans-impedance amplifier and an optical receiver including the same.

2. Description of the Related Art

An optical line terminal (OLT) is used in a station in an optical access system where the station is connected to a plurality of homes by optical fiber cables. To receive optical signals from the homes, the OLT uses an optical receiver including a photo detector, a trans-impedance amplifier, and so forth. In the optical receiver, the photo detector converts an optical signal to a current signal, and the trans-impedance amplifier amplifies the current signal, converts the amplified signal to a voltage signal, and outputs the voltage signal.

SUMMARY OF THE INVENTION

An aspect of the present invention relates to a trans-impedance amplifier that converts a current signal to a voltage signal, including: a terminal that receives the current signal; an amplifier that includes an input node connected to the terminal, the amplifier converting an input current received via the input node to the voltage signal; a first diode having an anode and a cathode, the cathode being connected to the terminal; a second diode having an anode and a cathode, the anode being connected to the terminal; a first current source connected to the anode of the first diode, the first current source supplying a first forward current to the first diode; a second current source connected to the cathode of the second diode, the second current source supplying a second forward current to the second diode; and a controller that controls the first current source and the second current source in order that the first forward current and the second forward current are increased, when the amplitude of the voltage signal increases, and that the first forward current and the second forward current are decreased, when the amplitude of the voltage signal decreases.

An aspect of the present invention relates to an optical receiver including: an optical receiving section that converts an optical signal to a current signal; and a trans-impedance amplifier that converts the current signal to a voltage signal. The trans-impedance amplifier includes: a terminal that receives the current signal; an amplifier that includes an input node connected to the terminal, the amplifier converting an input current received via the input node to the voltage signal; a first diode having an anode and a cathode, the cathode being connected to the terminal; a second diode having an anode and a cathode, the anode being connected to the terminal; a first current source connected to the anode of the first diode, the first current source supplying a first forward current to the first diode; a second current source connected to the cathode of the second diode, the second current source supplying a second forward current to the second diode; and a controller that controls the first current source and the second current source in order that the first forward current and the second forward current increase and decrease in accordance with an increase and decrease in the voltage signal.

DESCRIPTION OF THE PREFERRED EMBODIMENTS

Figure 1A:
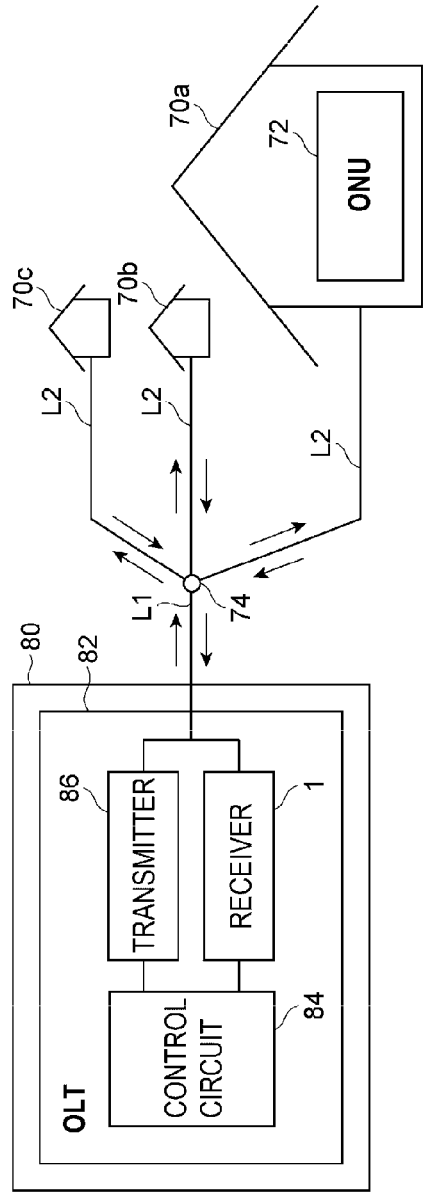
FIG. 1A is a block diagram illustrating an exemplary configuration of an optical access system using a passive optical network (PON) system.

A communication system using a passive optical network (PON) system will be described as an example of an optical access system according to an embodiment of the present invention. FIG. 1A is a block diagram illustrating an exemplary configuration of an optical access system using the PON system. An optical line terminal (OLT) 82 in a station 80 is connected to an optical network unit (ONU) 72 in each of homes 70a to 70c via signal paths L1 and L2 configured by optical fiber cables. The OLT 82 is connected to an optical splitter 74 via one signal path L1. The optical splitter 74 is connected one-to-one to the ONUs 72 via the signal paths L2 configured by optical fiber cables. The optical splitter 74 couples the signal path L1 to the signal paths L2, thereby enabling mutual transmission of optical signals.

The OLT 82 outputs an optical signal, which is to be transmitted to each ONU 72, to the signal path L1, and receives an optical signal, which is transmitted from each ONU 72, from the signal path L1. The OLT 82 includes a control circuit 84, a transmitter 86, and a receiver 1. The transmitter 86 is an optical transmitter that transmits optical signals to each ONU 72. The receiver 1 is an optical receiver that receives optical signals from each ONU 72. The control circuit 84 is a circuit that controls the optical transmitter 86 and the optical receiver 1. An optical signal transmitted by the optical transmitter 86 and an optical signal received by the optical receiver 1 have different wavelengths. This enables bi-directional communication with the use of one optical fiber cable.

Figure 1B:
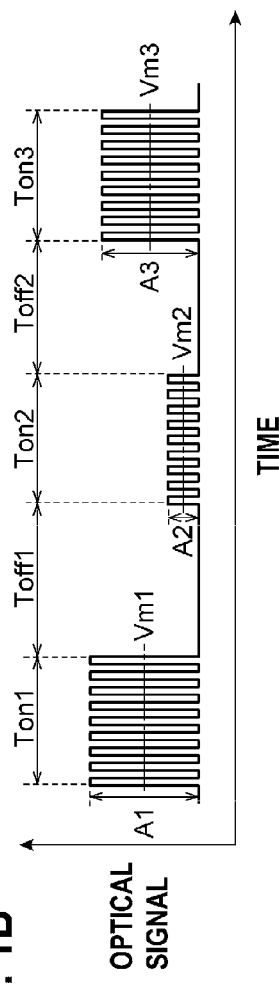
FIG. 1B is a schematic diagram illustrating transient change in an optical signal received by an OLT.

FIG. 1B is a schematic diagram illustrating transient change in the signal amplitude of an optical signal input to the optical receiver 1. The ONUs 72 perform time-sharing transmission. Therefore, the OLT 82 receives an optical signal transmitted from the ONU 72 in the home 70a during a period Ton1. Next, after a period Toff1 where there are no optical signals, the OLT 82 receives an optical signal from the ONU (not illustrated) in the home 70b during a period Ton2. Furthermore, after a period Toff2 where there are no optical signals, the OLT 82 receives an optical signal from the ONU (not illustrated) in the home 70c during a period Ton3.

Optical signals transmitted from the individual ONUs 72 have different amplitudes, and their attenuations while being transmitted through the signal paths L2 are also different. Therefore, optical signals in the periods Ton1, Ton2, and Ton3 (input signal periods) respectively have different amplitudes, namely, amplitudes A1, A2, and A3. The single optical receiver 1 for a PON system receives many optical signals with different amplitudes by using a time-sharing system. Note that the periods Toff1 and Toff2 are periods (interval periods) for switching the signal path L2 (and the ONU 72 connected therethrough). As an amplifier used in the optical receiver 1, a feedback control circuit for coping with the transient change in the amplitude of an optical signal is used.

Figure 2:
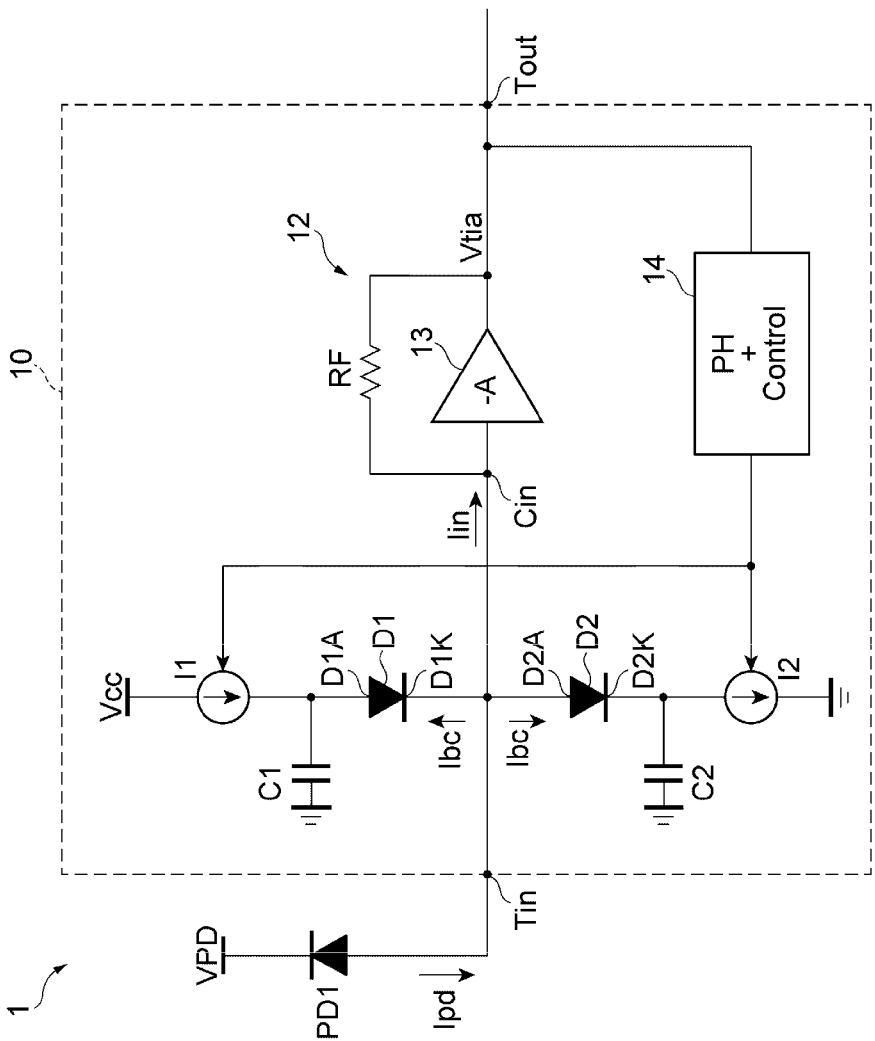
FIG. 2 is a circuit diagram of a receiver (optical receiver) according to an embodiment of the present invention.

Next, the configuration of the optical receiver 1 will be described in detail. FIG. 2 is a circuit diagram of the optical receiver 1 according to the embodiment of the present invention. Note that FIG. 2 illustrates only part of the configuration of the optical receiver 1. The optical receiver 1 is included in the OLT 82 as mentioned above. For example, the optical receiver 1 may include, besides the elements illustrated in FIG. 2, a limiting amplifier (LIA) and a clock data recovery. The LIA converts a voltage signal with fluctuating amplitude to a voltage signal with constant amplitude and outputs this voltage signal. The CDR extracts a clock signal from the signal output from the LIA and recovers the signal by using the extracted clock signal.

Figure 3:
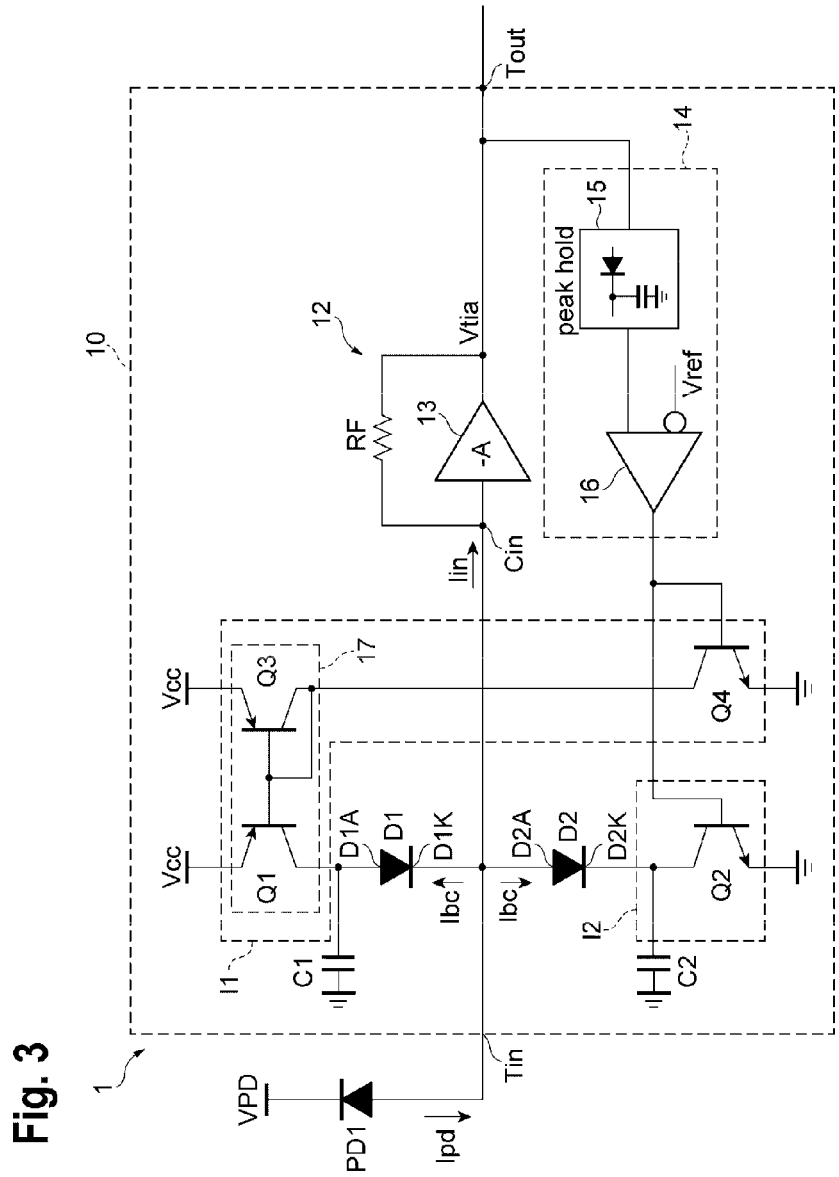
FIG. 3 is a circuit diagram illustrating the details of the circuit diagram illustrated in FIG. 2.

FIG. 3 is a circuit diagram illustrating the details of the circuit diagram illustrated in FIG. 2.

The optical receiver 1 is used in, for example, a 10 Gigabit Ethernet Passive Optical Network (10G-EPON) system. As illustrated in FIG. 2, the optical receiver 1 includes a photo detector PD1 and a trans-impedance amplifier (TIA) 10.

The photo detector PD1 converts an optical signal, which the optical receiver 1 receives, to an electrical signal, which is more specifically a current signal. The photo detector PD1 is, for example, an avalanche photo diode (APD). The cathode of the photo detector PD1 is connected to a power supply VPD. The anode of the photo detector PD1 is connected to an input terminal Tin of the TIA 10. The input terminal Tin receives a current signal Ipd (photocurrent), which the photo detector PD1 converts the optical signal to. That is, the TIA 10 receives the current signal Ipd, output from the photo detector PD1, via the input terminal Tin.

The TIA 10 amplifies the current signal Ipd, converts the amplified signal to a voltage signal. The TIA 10 provides the voltage signal to an LIA (not illustrated) via an output node Tout. Note that the TIA 10 and the LIA (not illustrated) are AC-coupled by a capacitor (not illustrated).

As illustrated in FIG. 2, the TIA 10 includes a TIA core 12, a controller 14, current sources I1 and I2 (a first current source and a second current source), and diodes D1 and D2 (a first diode and a second diode).

The TIA core 12 includes an amplifier 13 and a feedback resistor RF. The TIA core 12 converts the input current signal Iin to a voltage signal with performing amplification, and outputs the voltage signal as a voltage signal Vtia. The TIA core 12 includes an input node Cin, which is connected to the input terminal Tin of the TIA 10. Therefore, the TIA core 12 receives the current signal Iin via the input node Cin, and converts the current signal Iin to the voltage signal Vtia. The TIA core 12 is further connected to the anode of the photo detector PD1 via the input terminal Tin. The current signal Iin is a part of the current signal Ipd as described later.

The controller 14 detects a peak voltage value as the amplitude of the voltage signal Vtia, as described later, and outputs a control signal in accordance with the peak voltage value to the current sources I1 and I2. The current sources I2 and I2 supply forward currents as direct currents, respectively. The current sources I1 and I2 vary the respective forward currents in accordance with the control signal. The controller 14 generates a control signal for increasing the forward currents supplied by the current sources I1 and I2 when the peak voltage becomes larger and decreasing the forward currents supplied by the current source I1 and I2 when the peak voltage becomes smaller. That is, the controller 14 increases and decreases the forward currents supplied by the current sources I1 and I2 in accordance with an increase and decrease in the peak voltage value of the voltage signal Vtia.

More specifically, as illustrated in FIG. 3, the controller 14 includes a peak hold circuit 15 and a comparator 16. The peak hold circuit 15 detects the peak voltage value of the voltage signal Vtia and holds it for a certain period of time. The comparator 16 compares the peak voltage value, detected by the peak hold circuit 15, with a reference potential Vref, and outputs a control signal in accordance with the comparison result.

Referring back to FIG. 2, the current source I1 is connected to an anode D1A of the diode D1, and supplies a forward current (first forward current) to the diode D1. Here, a forward current is a current that flows from the anode to the cathode of a diode. The current source I1 increases and decreases the forward current supplied to the diode D1 in accordance with the control signal output from the controller 14. The current source I1 is connected between a power supply Vcc and the anode D1A of the diode D1. The current source I2 is connected to a cathode D2K of the diode D2, and supplies a forward current (second forward current) to the diode D2. The current source I2 increases and decreases the forward current supplied to the diode D2 in accordance with the control signal, like the current source 1. The current source I2 is connected between the cathode D2K of the diode D2 and the ground. The more detailed configuration of the current sources I1 and I2 will be described with reference to FIG. 3.

As illustrated in FIG. 3, the current source I1 includes transistors Q1 (first transistor), Q3 (third transistor), and Q4 (fourth transistor). The current source I2 includes a transistor Q2 (second transistor). The controller 14 generates a control signal in accordance with the peak voltage value of the voltage signal Vtia, and controls at least the transistors Q1 and Q2 using the control signal.

The transistors Q2 and Q4 are both NPN transistors and have similar physical arrangement, for example area of the emitter. The bases (control terminals) of the transistors Q2 and Q4 are both connected to the controller 14. That is, the bases (control terminals) of the transistors Q2 and Q4 are connected to an output terminal of the comparator 16. Thus, the comparator 16 provides a control signal to the bases of the transistors Q2 and Q4. The emitters (first current terminals) of the transistors Q2 and Q4 are grounded. The collector (second current terminal) of the transistor Q2 is connected to the cathode D2K of the diode D2, and the collector (second current terminal) of the transistor Q4 is connected to the collector (second current terminal) of the transistor Q3.

The transistors Q1 and Q3 are both PNP transistors and have similar physical arrangement, for example, base width, doping concentration in the base area, emitter size, and so forth. The collector (second current terminal) of the transistor Q3 is connected to the collector (second current terminal) of the transistor Q4, and to the base (control terminal) of the transistor Q3. The base (control terminal) of the transistor Q3 is connected to the base (control terminal) of the transistor Q1. The collector (second current terminal) of the transistor Q1 is connected to the anode D1A of the diode D1. The collector (second current terminal) of the transistor Q1 supplies a forward current (first forward current) to the diode D1.

The transistors Q1 and Q3 configure a current mirror circuit 17. That is, a collector current output from the collector (second current terminal) of the transistor Q3 becomes an input current (reference current) of the current mirror circuit 17, and a collector current output from the collector (second current terminal) of the transistor Q1 becomes an output current (mirror current) of the current mirror circuit 17. The output current is directly proportional to the input current. Therefore, for example, the current value of the collector current of the transistor Q1 can be made equal to the current value of the collector current of the transistor Q3 by setting the physical arrangement, for example size of emitter, of the transistor Q1 and the physical arrangement of the transistor Q3 to be identical. That is, at this time, the current mirror circuit 17 outputs an output current (mirror current) that has the same magnitude as the input current (reference current).

In the current source I2, the transistor Q2 outputs a collector current from the collector (second current terminal) and supplies a forward current (second forward current) to the diode D2. The collector current of the transistor Q2 flows from the collector (second current terminal) to the emitter (first current terminal). The transistor Q2 receives a control signal at its base (control terminal), and increases and decreases the collector current in accordance with the control signal. In doing so, the transistor Q2 increases and decreases the forward current supplied to the diode D2 in accordance with the control signal.

In the current source I2, the magnitude of the collector current of the transistor Q2 can be made equal to the magnitude of the collector current of the transistor Q4 by setting the physical arrangement, for example, area of the emitter, of the transistor Q2 to be identical to the physical arrangement of the transistor Q4 of the current mirror circuit 17. At the same time, in the current mirror circuit 17, the electrical characteristics of the transistors Q1, Q3, and Q4 are set in order that the magnitude of the collector current of the transistor Q1 becomes equal to the magnitude of the collector current of the transistor Q4. In doing so, the magnitude of the forward current (first current) supplied from the transistor Q1 of the current source I1 to the diode D1 can be made equal to the magnitude of the forward current (second current) supplied from the transistor Q2 of the current source I2 to the diode D2.

The emitters (first current terminals) of the transistors Q1 and Q3 are both connected to the power supply Vcc. For example, the electrical characteristics of the transistors Q2 and Q4 are set in order that the ratio of the magnitude of the collector current of the transistor Q2 and the magnitude of the collector current of the transistor Q4 becomes K:1 (K is a real number greater than or equal to 1). Furthermore, the electrical characteristics of the transistors Q1 and Q3 are set in order that the ratio of the magnitude of the output current (mirror current) of the current mirror circuit 17 (collector current of the transistor Q1) and the magnitude of the input current (collector current of the transistor Q3) becomes K:1. In doing so, because the collector current of the transistor Q3 is equal to the collector current of the transistor Q4, the collector current (second forward current) of the transistor Q2 and the collector current (first forward current) of the transistor Q1 can be made equal. Accordingly, the magnitude of a current flowing from the power supply Vcc to the ground via the transistors Q3 and Q4 can be made smaller than the magnitude of the first forward current and the second forward current. Since current flowing through the transistors Q3 and Q4 of the current source I1 does not contribute to the amplifying operation of the TIA 10, the power consumption of the TIA 10 can be reduced by decreasing the current flowing through the transistors Q3 and Q4.

Referring back to FIG. 2, the diode D1 is connected between the current source I1 and the input terminal Tin. More specifically, the cathode D1K of the diode D1 is connected to the input terminal Tin, and the anode D1A of the diode D1 is connected to the current source I1. The cathode D1K of the diode D1 is also connected to the anode D2A of the diode D2. The anode D1A of the diode D1 is grounded via a capacitor C1 (first capacitor).

The diode D2 is connected between the input terminal Tin and the current source I2. More specifically, the anode D2A of the diode D2 is connected to the input terminal Tin, and the cathode D2K of the diode D2 is connected to the current source I2. The anode D2A of the diode D2 is also connected to the cathode D1K of the diode D1. The cathode D2K of the diode D2 is grounded via a capacitor C2 (second capacitor). The diodes D1 and D2 have identical electrical characteristics.

Next, referring to FIGS. 2 and 3, the operation of the above-mentioned optical receiver 1 will be described. In the optical receiver 1, the photo detector PD1 converts an optical signal to a current signal Ipd (photocurrent). Part of the current signal Ipd is input as the current signal Iin to the TIA core 12. The TIA core 12 amplifies the current signal Iin, converts the amplified signal to a voltage signal, and outputs the voltage signal as a voltage signal Vtia.

Next, the peak hold circuit 15 of the controller 14 detects the peak voltage value of the voltage signal Vtia, output from the TIA core 12. The comparator 16 of the controller 14 compares the peak voltage value, detected by the peak hold circuit 15, with the reference potential Vref, and outputs a control signal in accordance with the comparison result. The peak voltage value is treated as a value equivalent to the amplitude of the voltage signal Vtia, for example, when the bottom voltage value of the voltage signal Vtia is kept in a constant value.

For example, when the waveform of the voltage signal Vtia is such that its low level is always fixed to a constant reference potential, like the waveforms of the optical signals illustrated in FIG. 1B, the peak voltage value becomes equal to the voltage amplitude. Conversely, when the high level of the waveform of the voltage signal Vtia is fixed to a constant reference potential, a bottom hold circuit that detects a bottom voltage value may be used instead of a peak hold circuit. In that case, the difference between the reference potential and the bottom voltage value becomes equal to the voltage amplitude.

A control signal output from the comparator 16 is input to the bases of the transistors Q2 and Q4. Here, the transistors Q1 and Q3 configure the current mirror circuit 17. The collector (second current terminal) of the transistor Q3 is connected to the collector (second current terminal) of the transistor Q4, and to the base (control terminal) of the transistor Q3. Furthermore, the base (control terminal) of the transistor Q3 is connected to the base (control terminal) of the transistor Q1. The collector (second current terminal) of the transistor Q1 is connected in series with the collector (second current terminal) of the transistor Q2 via the diodes D1 and D2. With the configuration of these transistors Q1 to Q4, the magnitude of the forward current (first forward current) supplied by the current source I1 to the diode D1 and the magnitude of the forward current (second forward current) supplied by the current source I2 to the transistor Q2 can be made equal. Note that the collector currents of the transistors Q1 to Q4 and the forward currents supplied to the diodes D1 and D2 are all direct currents.

When the peak voltage value detected by the peak hold circuit 15 is small, the forward currents supplied by the current sources I1 and I2 are small; thus, the impedances of the diodes D1 and D2 become relatively high values in comparison with input impedance of the TIA core 12. At this time, almost all of the current signal Ipd straight flows into the TIA core 12. This point is necessary for keeping the noise in the input signal Iin small in signal amplification performed by the TIA core 12.

In contrast, when the peak voltage value of the voltage signal Vtia becomes large and the forward currents (direct currents) supplied by the current sources I1 and I2 are increased, the impedances of the diodes D1 and D2 become relatively small values in comparison with the input impedance of the TIA core 12. When the impedances of the diodes D1 and D2 become values less than a certain value, high frequency components of the current signal Ipd starts to flow as bypass currents Ibc through the diodes D1 and D2 to the ground.

Accordingly, the current signal Iin input to the TIA core 12 has a magnitude obtained by subtracting two bypass currents Ibc from the current signal Ipd. The TIA core 12 amplifies the current signal Iin, from which the two bypass currents Ibc have been subtracted, and outputs the voltage signal Vtia. As has been described above, when the amplitude of the voltage signal Vtia becomes larger than a value set by the reference potential Vref, part of the current signal Ipd is branched to the diodes D1 and D2, thereby lowering the magnitude of the current signal Iin input to the TIA core 12.

Next, advantages achieved by the optical receiver 1 according to the embodiment of the present application will be described.

In the optical receiver 1 according to the embodiment of the present application, the TIA core 12 amplifies the current signal Ipd, converts the amplified signal to a voltage signal, and outputs this voltage signal as the voltage signal Vtia. The peak hold circuit 15 detects the peak voltage value of the voltage signal Vtia. The comparator 16 compares the peak voltage value, output from the peak hold circuit 15, with the reference potential Vref, and generates a control signal in accordance with the comparison result. In accordance with the control signal, the transistor Q1 of the current source I1 supplies a forward current (first forward current) to the diode D1, and the transistor Q2 of the current source I2 supplies a forward current (second forward current) to the diode D2. In this configuration, the larger the peak voltage value of the voltage signal Vtia output from the TIA core 12, the larger the forward currents (first forward current and second forward current) supplied from the transistors Q1 and Q2 to the diodes D1 and D2, respectively.

As the forward currents supplied from the transistors Q1 and Q2 become larger, the impedances of the diodes D1 and D2, through which these forward currents flow, become smaller. The cathode D1K of the diode D1 and the anode D2A of the diode D2 are both connected to the output terminal of the photo detector PD1 through the input terminal Tin. When the impedances of the diodes D1 and D2 decrease to a certain degree, part of the current signal Ipd output from the photo detector PD1 starts to flow as bypass currents Ibc through the diodes D1 and D2. With this mechanism, when the peak voltage value of the voltage signal Vtia output from the TIA core 12 becomes large, the bypass currents Ibc flowing from the photo detector PD1 to the diodes D1 and D2 can be increased, thereby reducing the current signal Iin input to the TIA core 12. Therefore, in the amplifying operation of the TIA core 12, the current signal Iin can be prevented from becoming so large that the amplitude of the voltage signal Vtia is saturated. Accordingly, the linearity of the output signal Vtia with respect to the input signal Iin of the TIA core 12 can be secured.

Figure 4:
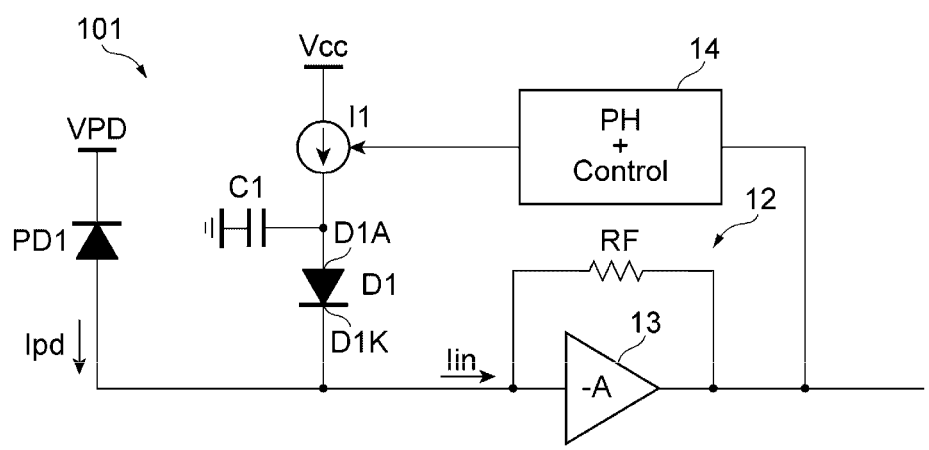
FIG. 4 is a circuit diagram of a receiver according to a comparative example.

The optical receiver 1 according to the embodiment of the present invention includes the diode D1 whose cathode D1K is connected to the output terminal of the photo detector PD1, the diode D2 whose anode D2A is connected to the output terminal of the photo detector PD1, and the current sources I1 and I2 for supplying forward currents to the diodes D1 and D2, respectively. Instead of this configuration, for example, an optical receiver 101 according to a comparative example illustrated in FIG. 4 will be discussed. The optical receiver 101 according to the comparative example includes the diode D1 and the current source I1, but includes neither the diode D2 nor the current source I2, compared with the optical receiver 1 according to the embodiment of the present invention.

Figure 5:
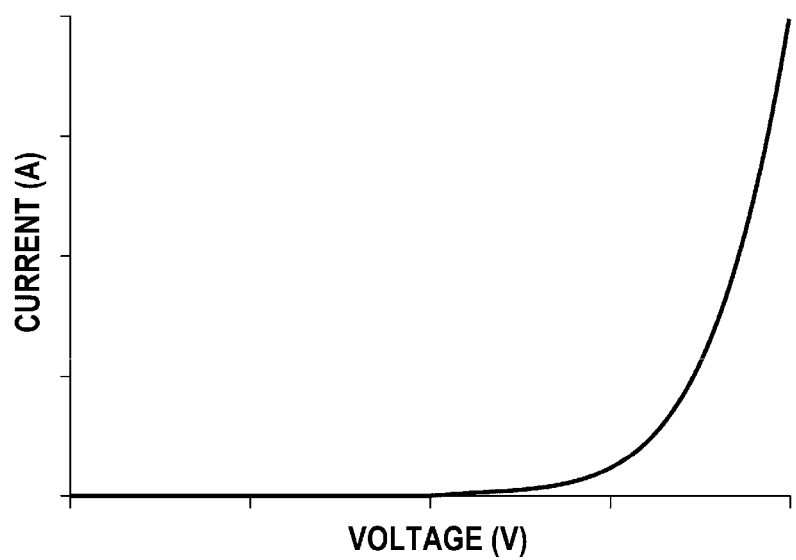
FIG. 5 is a graph illustrating the current-voltage characteristics of a diode.

The current-voltage characteristics of a diode are generally non-linear, as illustrated in FIG. 5. Thus, the impedance of a diode varies in accordance with the magnitude of a direct current flowing through the diode. For example, the differential coefficient (slope) of a curve indicating the current-voltage characteristics illustrated in FIG. 5 corresponds to the conductance, and the impedance corresponds to the reciprocal of the conductance. Here, a positive current corresponds to a forward current. Therefore, the impedance becomes larger (slope becomes smaller) as the forward current becomes smaller, and the impedance becomes smaller (slope becomes larger) as the forward current becomes larger. Accordingly, the diode that receives a larger bias current (forward current) flowing therein provides lower impedance (higher conductance) of the diode to an electrical element connected to the diode. Specifically, the impedance steeply varies around a value of bias current, which corresponds to a threshold voltage of the diode.

Due to the non-linearity of a diode as shown in FIG. 5, the linearity of the output signal Vtia with respect to the input signal Iin of the TIA core 12 may not be secured. Thus, like the optical receiver 101 according to the comparative example illustrated in FIG. 4, a configuration that only includes the diode D1 on the supply voltage Vcc side may be unable to secure the linearity of the output signal Vtia with respect to the input signal Iin because of the non-linearity of a diode.

With regard to this point, the optical receiver 1 according to the embodiment of the present invention includes not only the diode D1, connected in the forward direction between the output terminal of the photo detector PD1 and the supply voltage Vcc, but also the diode D2, connected in the forward direction between the output terminal of the photo detector PD1 and the ground potential. The impedances of the two diodes D1 and D2 vary so as to mutually compensate for the non-linearity characteristics thereof. Thus, the non-linearity characteristics of the two diodes D1 and D2 are cancelled out each other. The two diodes D1 and D2 are provided symmetrically on a higher-potential side and a lower-potential side with reference to the input signal, thereby cancelling out the non-linear characteristics thereof. Accordingly, the non-linearity of each diode can be improved apparently. Thus, the configuration of the diodes according to the embodiment of the present invention improves the non-linearity of each diode and more suitably improves the linearity of the output signal of the TIA core 12.

The advantage of improving the linearity of the output signal of the optical receiver 1 according to the embodiment of the present invention will be described with reference to FIGS. 6 and 7.

Figure 6:
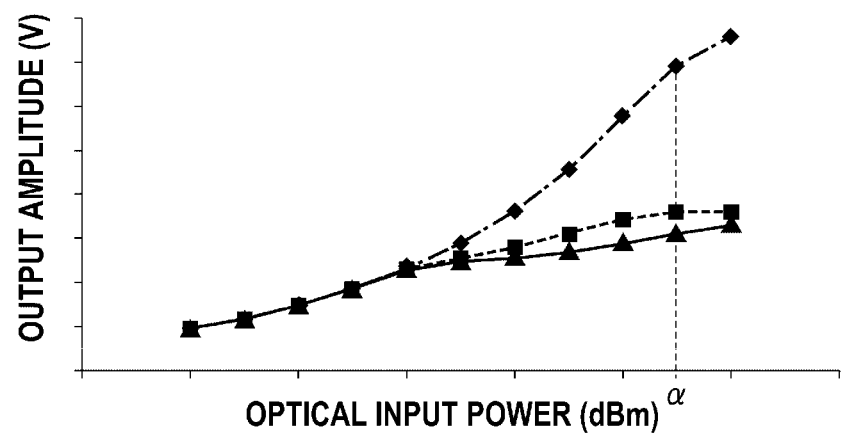
FIG. 6 is a graph illustrating the relationship between the optical input power of an optical signal (an input signal of the receiver) and the output amplitude of an electrical signal (an output signal of the receiver).

In FIG. 6, the horizontal axis represents the optical input power [dBm] of an optical signal input to the optical receiver 1, and the vertical axis represents the output amplitude [V] of the voltage signal Vtia. In the line graph, a solid line segment represents the results obtained by the optical receiver 1 according to the embodiment of the present invention, a dashed line segment represents the results obtained by the optical receiver 101 according to the comparative example, and a dash-dot line segment represents the results obtained by an optical receiver including neither the diodes D1 and D2 nor the current sources I1 and I2. As illustrated in FIG. 6, in the optical receiver 1 and the optical receiver 101 according to the comparative example, the output amplitude gradually increase even in a region where the optical input power is relatively large, because an increase in the current signal Iin input to the TIA core 12 is suppressed as described above. In contrast, in the optical receiver without the two diodes connected to the input terminal, the output amplitude of the voltage signal Vtia becomes larger as the optical input power becomes larger, thereby deteriorating the linearity.

Figure 7:
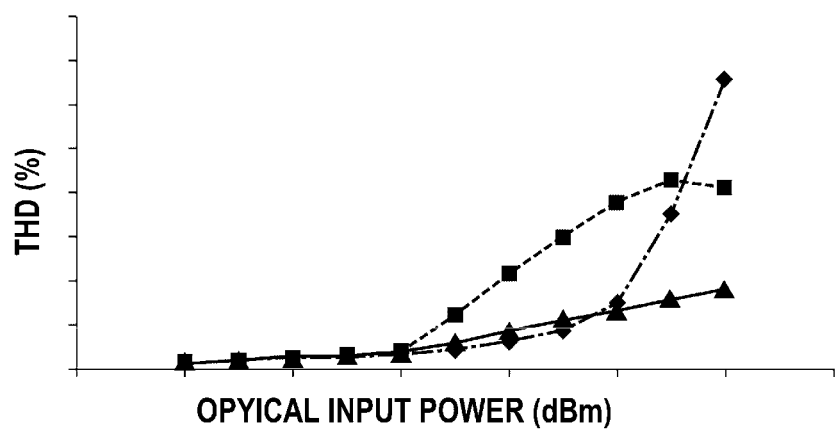
FIG. 7 is a graph illustrating the relationship between the optical input power of an optical signal (an input signal of the receiver) and the distortion (factor) of an electrical signal (an output signal of the receiver).

In FIG. 7, the horizontal axis represents the optical input power [dBm] of an optical signal input to the optical receiver, and the vertical axis represents the total harmonic distortion (THD) [%] of a voltage signal output by the TIA core. In the line graph, a solid line segment represents the results obtained by the optical receiver 1 according to the embodiment of the present invention, a dashed line segment represents the results obtained by the optical receiver 101 according to the comparative example, and a dash-dot line segment represents the results obtained by an optical receiver including neither the diodes D1 and D2 nor the current sources I1 and I2. Note that the THD indicates the proportion of higher harmonics included in an output signal when, for example, a 1-GHz sine wave serves as an input signal. In general, the smaller the THD, the smaller the distortion, and the better the linearity of the output signal with respect to the input signal. As illustrated in FIG. 7, the distortion (factor) of the optical receiver 1 is kept small, compared with the optical receiver 101 according to the comparative example and the optical receiver without the diodes D1 and D2. In particular, even when the optical input power is large, the distortion (factor) of the optical input power 1 is kept small, compared with optical receivers with other configurations.

Figure 8:
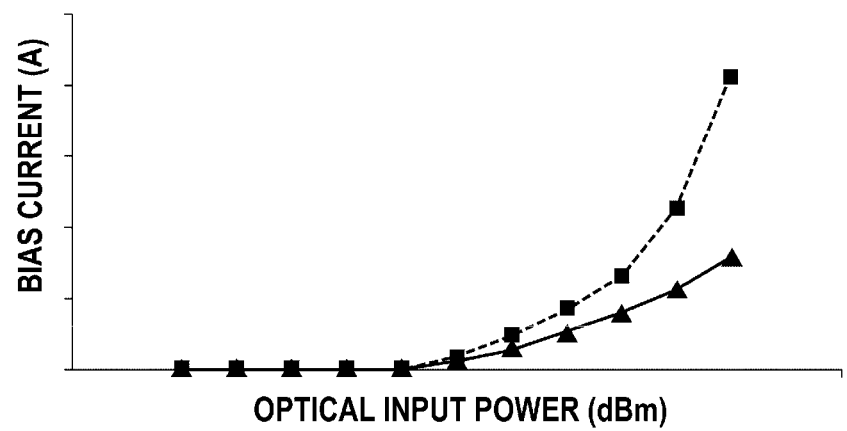
FIG. 8 is a graph illustrating the relationship between the optical input power of the optical signal and a bias current in a trans-impedance amplifier.

The optical receiver 1 according to the embodiment of the present invention is better than the optical receiver 101 according to the comparative example in terms of power consumption reduction. The advantage of power consumption reduction will be described with reference to FIG. 8. In FIG. 8, the horizontal axis represents the optical input power [dBm] of an optical signal input to the optical receiver, and the vertical axis represents a bias current [A] flowing through a diode connected to the input terminal Tin. The bias current corresponds to a direct current that has been referred to as a forward current in the above description. In the line graph, a solid line segment represents the results obtained by the optical receiver 1 according to the embodiment of the present invention, and a dashed line segment represents the results obtained by the optical receiver 101 according to the comparative example. The bias current is a direct current (forward current) supplied by a current source to a diode. The diode in which a larger bias current (forward current) is flowing provides lower impedance (higher conductance) of the diode to an element connected to the diode. As illustrated in FIG. 8, the bias current is smaller in the optical receiver 1 than in the optical receiver 101 according to the comparative example.

This is because the optical receiver 1 where the diodes D1 and D2 are connected to a higher-potential side and a lower-potential side of an input signal requires smaller bias current for obtaining the same impedance, compared with, for example, the optical receiver 101 where only one diode is connected to a higher-potential side. In other words, given bias currents with the same magnitude, the reduction ability of the optical receiver 1 is twice as that of the optical receiver 101. This is because only one diode is connected to the input terminal Tin in the optical receiver 101, whereas the number of diodes is twice in the optical receiver 1.

More specifically, in the optical receiver 1 according to the embodiment of the present invention, the magnitude of a forward current supplied by the transistor Q1 of the current source I1 is substantially equal to the magnitude of a forward current supplied by the transistor Q2 of the current source I2. Accordingly, the impedances of the diodes D1 and D2 can be made values that are substantially equal by setting the electrical characteristics of the diodes D1 and D2 to be identical. In doing so, the bypass current Ibc flowing from the photo detector PD1 to the diode D1 and the bypass current Ibc flowing from the photo detector PD1 to the diode D2 become substantially equal, and the advantage of cancelling out the non-linearity characteristics of the diodes D1 and D2 described above can be more suitably exhibited.

Note that the forward currents supplied by the current source I1 (transistor Q1) and the current source I2 (transistor Q2) are direct currents (bias currents) as described above, and are controlled in accordance with the amplitude of the voltage signal Vtia in order to adjust the impedances of the diodes D1 and D2.

In contrast, the current signals Ipd and Iin and the bypass currents Ibc are high-frequency signals (alternating currents), and are not directly affected by direct currents supplied by the current source I1 (transistor Q1) and the current source I2 (transistor Q2). Thus, the magnitude of the bypass currents Ibc varies in accordance with the impedances of the diodes D1 and D2, and a current obtained by subtracting the bypass currents Ibc from the current signal Ipd is input as the current signal Iin to the TIA core 12.

From the above, the optical receiver 1 is better than optical receivers with other configurations in terms of power consumption reduction.

In the optical receiver 1 according to the embodiment of the present invention, the transistor Q1 of the current source I1 and the transistor Q2 of the current source I2 are included in the same TIA 10. The collector (second current terminal)

of the transistor Q3 is connected to the collector (second current terminal) of the transistor Q4 and to the base (control terminal) of the transistor Q3; the base (control terminal) of the transistor Q3 is connected to the base (control terminal) of the transistor Q1; and the collector (second current terminal) of the transistor Q1 is connected in series with the collector (second current terminal) of the transistor Q2 via the diodes D1 and D2. The transistors Q1 and Q3 are set to have similar physical arrangement, and the transistors Q2 and Q4 have similar physical arrangement, too. With such a configuration, the magnitude of a forward current supplied by the transistor Q1 and the magnitude of a forward current supplied by the transistor Q2 can be easily made substantially equal.

The anode D1A of the diode D1 and the cathode D2K of the diode D2 are grounded via the capacitors C1 and C2, respectively. In doing so, the diode D1 and the diode D2 can be short-circuited at the ground potential in terms of alternating current. Accordingly, the diode D1 and the diode D2 can serve as a bypass circuit for splitting the bypass current Ibc from the photo detector PD1 side.

Although the embodiment of the present invention has been described above, the present invention is not limited to the above-described embodiment. For example, although it has been described that the value of a forward current supplied by the first current source is identical to the value of a forward current supplied by the second current source, the present invention is not limited to this case, and these forward currents may have different values. Although it has been described that the first current source and the second current source are included in the same current mirror circuit, the present invention is not limited to this case.

Although it has been described that the controller 14 detects the peak voltage value of the voltage signal Vtia output from the TIA core 12, the present invention is not limited to this case, and the controller 14 may detect, for example, the average of output signals Vtia.

What is claimed is:

1. A trans-impedance amplifier that converts a current signal to a voltage signal, comprising:
   a terminal that receives the current signal;
   an amplifier that includes an input node connected to the terminal, the amplifier converting an input current received via the input node to the voltage signal;
   a first diode having an anode and a cathode, the cathode being connected to the terminal;
   a second diode having an anode and a cathode, the anode being connected to the terminal;
   a first current source connected to the anode of the first diode, the first current source supplying a first forward current to the first diode;
   a second current source connected to the cathode of the second diode, the second current source supplying a second forward current to the second diode; and
   a controller that detects amplitude of the voltage signal and controls the first current source and the second current source in order to increase the first forward current and the second forward current, when the amplitude of the voltage signal increases, and to decrease the first forward current and the second forward current, when the amplitude of the voltage signal decreases.

2. The trans-impedance amplifier according to claim 1, wherein:
   the controller generates a control signal in accordance with the amplitude of the voltage signal,
   the first current source varies magnitude of the first forward current in accordance with the control signal, and
   the second current source varies magnitude of the second forward current in accordance with the control signal.

3. The trans-impedance amplifier according to claim 2, wherein:
   the first current source includes a first transistor that outputs the first forward current in accordance with the control signal,
   the second current source includes a second transistor that outputs the second forward current in accordance with the control signal, and
   the controller increases the first forward current and the second forward current by increasing the control signal when the amplitude of the voltage signal is greater than a set value, and decreases the first forward current and second forward current by decreasing the control signal when the amplitude of the voltage signal is smaller than the set value.

4. The trans-impedance amplifier according to claim 3, wherein:
   the first current source further includes a third transistor that configures a current mirror circuit together with the first transistor and controls the first transistor for supplying the first forward current directly proportional to a reference current, and a fourth transistor that is connected in series with the third transistor and that supplies the reference current to the current mirror circuit, and
   the controller controls the fourth transistor and the second transistor using the control signal.

5. The trans-impedance amplifier according to claim 2, wherein the second current source generates the second forward current having magnitude identical to magnitude of the first forward current.

6. The trans-impedance amplifier according to claim 5, wherein the second diode has current-voltage characteristics that are substantially identical to current-voltage characteristics of the first diode.

7. The trans-impedance amplifier according to claim 1, wherein:
   the anode of the first diode is grounded via a first capacitor, and
   the cathode of the second diode is grounded via a second capacitor.

8. An optical receiver comprising:
   an optical receiving section that converts an optical signal to a current signal; and
   a trans-impedance amplifier that converts the current signal to a voltage signal, the trans-impedance amplifier including:
   a terminal that receives the current signal;
   an amplifier that includes an input node connected to the terminal, the amplifier converting an input current received via the input node to the voltage signal;
   a first diode having an anode and a cathode, the cathode being connected to the terminal;
   a second diode having an anode and a cathode, the anode being connected to the terminal;
   a first current source connected to the anode of the first diode, the first current source supplying a first forward current to the first diode;
   a second current source connected to the cathode of the second diode, the second current source supplying a second forward current to the second diode; and a controller that controls the first current source and the second current source in order to increase and decrease the first forward current and the second forward current in accordance with an increase and decrease in the voltage signal.

\* \* \* \* \*